United States Patent
Basker et al.

(10) Patent No.: US 9,373,618 B1
(45) Date of Patent: Jun. 21, 2016

(54) INTEGRATED FINFET CAPACITOR

(71) Applicant: International Business Machines Corporation, Amonk, NY (US)

(72) Inventors: Veeraraghavan Basker, Schenectady, NY (US); Kangguo Cheng, Schenectady, NY (US); Theodorus Standaert, Clifton Park, NY (US); Junli Wang, Singerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/845,442

(22) Filed: Sep. 4, 2015

(51) Int. Cl.
| | | |
|---|---|---|
| *H01L 27/108* | (2006.01) | |
| *H01L 27/06* | (2006.01) | |
| *H01L 29/66* | (2006.01) | |
| *H01L 29/49* | (2006.01) | |
| *H01L 29/78* | (2006.01) | |
| *H01L 49/02* | (2006.01) | |
| H01L 21/8239 | (2006.01) | |
| H01L 21/8234 | (2006.01) | |

(52) U.S. Cl.
CPC ............ *H01L 27/0629* (2013.01); *H01L 28/60* (2013.01); *H01L 29/495* (2013.01); *H01L 29/66545* (2013.01); *H01L 29/7851* (2013.01); H01L 21/8239 (2013.01); H01L 21/823431 (2013.01); H01L 27/10826 (2013.01); H01L 27/10879 (2013.01)

(58) Field of Classification Search
CPC ................... H01L 27/10826; H01L 27/10879; H01L 21/8239; H01L 21/823431

USPC ......................................................... 257/301
See application file for complete search history.

(56) References Cited

U.S. PATENT DOCUMENTS

| | | | |
|---|---|---|---|
| 6,947,275 B1 | 9/2005 | Anderson et al. | |
| 6,995,412 B2 | 2/2006 | Fried et al. | |
| 7,859,081 B2 | 12/2010 | Doyle et al. | |

(Continued)

FOREIGN PATENT DOCUMENTS

| | | |
|---|---|---|
| WO | 2014039558 A1 | 3/2014 |
| WO | 2014126811 A1 | 8/2014 |

OTHER PUBLICATIONS

List of IBM Patents or Patent Applications Treated as Related; (Appendix P), Filed Feb. 4, 2016; 2 pages.

(Continued)

*Primary Examiner* — George Fourson, III
(74) *Attorney, Agent, or Firm* — Cantor Colburn LLP; Vazken Alexanian

(57) ABSTRACT

A technique relates to forming a semiconductor device. A field-effect transistor structure having a substrate, a fin structure patterned in the substrate, a gate stack structure, and an insulator layer is first provided. A non-capacitor region and a capacitor region are then formed on the field-effect transistor structure by masking portions of the field-effect transistor structure with a mask such that a non-capacitor region is masked and a capacitor region is exposed, and etching the insulator layer to further recess the fin structure and gate stack structure within the capacitor region such that a revealed height of the fins within the capacitor region is increased relative to the revealed height of the fins in the non-capacitor region. A high-k layer can be deposited over the recessed fins and gate stack structures and a gate metal can fill the recessed portions therein.

7 Claims, 14 Drawing Sheets

(56) References Cited

U.S. PATENT DOCUMENTS

| | | |
|---|---|---|
| 8,420,476 B2 | 4/2013 | Booth, Jr. et al. |
| 8,581,320 B1 | 11/2013 | Cheng et al. |
| 8,703,553 B2 | 4/2014 | Cheng et al. |
| 8,815,661 B1 | 8/2014 | Basker et al. |
| 8,841,185 B2 | 9/2014 | Khakifirooz et al. |
| 2013/0113072 A1 | 5/2013 | Liu et al. |
| 2013/0270620 A1* | 10/2013 | Hu ................... H01L 21/76229 257/296 |
| 2014/0042547 A1* | 2/2014 | Khakifirooz ........ H01L 27/0805 257/368 |
| 2014/0061744 A1 | 3/2014 | Zhang et al. |
| 2014/0124863 A1* | 5/2014 | Cheng ................... H01L 21/845 257/350 |
| 2015/0097220 A1* | 4/2015 | Ponoth ................ H01L 27/0629 257/296 |
| 2015/0206885 A1* | 7/2015 | Barth, Jr. .......... H01L 27/10826 257/301 |

OTHER PUBLICATIONS

Veeraraghavan Basker, et al., "Integrated FINFET Capacitor," U.S. Appl. No. 14/950,141, filed Nov. 24, 2015.

* cited by examiner

INTEGRATED FINFET CAPACITOR

BACKGROUND

The present invention relates to metal-oxide-semiconductor field-effect transistors (MOSFET), and more specifically, to fin-type field-effect transistors (FinFET).

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field-effect transistors (NFET) and p-type field-effect transistors (PFET) are two types of complementary MOSFETs. The NFET uses electrons as the majority current carriers and is built directly in a p substrate with n-doped source and drain junctions. The PFET uses holes as the majority current carriers and is built in an n-well with p-doped source and drain junctions.

The fin-type field-effect transistor (FinFET) is a type of MOSFET. The FinFET contains a conformal gate around the fin that mitigates the effects of short channels and reduces drain-induced barrier lowering. The "fin" refers to the narrow channel between source and drain regions. Often, a thin insulating high-k gate oxide layer around the fin separates the fin channel from the gate metal.

Integrated capacitors can be formed on a FinFET type MOSFET. Such capacitors can be formed in an integrated circuit employing process steps that are required for forming the other integrated components. In this manner, the number of steps required for forming the integrated circuit can be minimized. Moreover, capacitance of integrated capacitors can be increased by increasing the surface area of the capacitor, however, when integrated in a MOSFET system lateral space on the MOSFET is limited.

SUMMARY

According to an embodiment of the present invention, a method of forming a semiconductor device is provided. The method includes providing a field-effect transistor structure having a substrate, a fin structure patterned in the substrate, a gate stack structure, and an insulator layer. The method also includes forming a non-capacitor region and a capacitor region on the field-effect transistor structure by masking portions of the field-effect transistor structure with a mask such that a non-capacitor region is masked and a capacitor region is exposed and etching the insulator layer to further recess the fin structure and gate stack structure within the capacitor region such that a revealed height of the fins within the capacitor region is increased relative to the revealed height of the fins in the non-capacitor region. Additionally, the method includes depositing a high-k layer over the recessed fins and gate stack structures and filling the recessed portions with a gate metal.

According to one embodiment, a method of forming a semiconductor device is provided. The method includes providing a field-effect transistor structure having a substrate, a fin structure patterned in the substrate, a gate stack structure, a hardmask layer formed over the gate stack structure and the fin structure, and an insulator layer. The method also includes forming a non-capacitor region and a capacitor region on the field-effect transistor structure by masking portions of the field-effect transistor structure with a mask such that a non-capacitor region is masked and a capacitor region is exposed. The method additionally includes etching the insulator layer selectively to the hardmask layer and the mask and etching the hardmask layer selectively to the gate stack structure, insulator layer, and mask, and etching the insulator layer selective to the mask to further recess the fin structure and gate stack structure within the capacitor region such that a revealed height of the fins within the capacitor region is increased relative to the revealed height of the fins in the non-capacitor region. Moreover, the method includes depositing a high-k layer over the recessed fins and gate stack structures and filling the recessed portions with a gate metal.

According to one embodiment, an integrated capacitor device is provided. The device includes a fin structure patterned in a substrate, a gate stack structure formed over the fin structure, and an insulator layer disposed over the substrate. The device further includes a non-capacitor region comprising a portion of the fin structure, gate stack structure, and insulator layer, and a capacitor region comprising a portion of the fin structure, gate stack structure, and insulator layer such that the fin structure forming the capacitor region has a recessed insulator layer relative to the insulator layer of the non-capacitor region.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
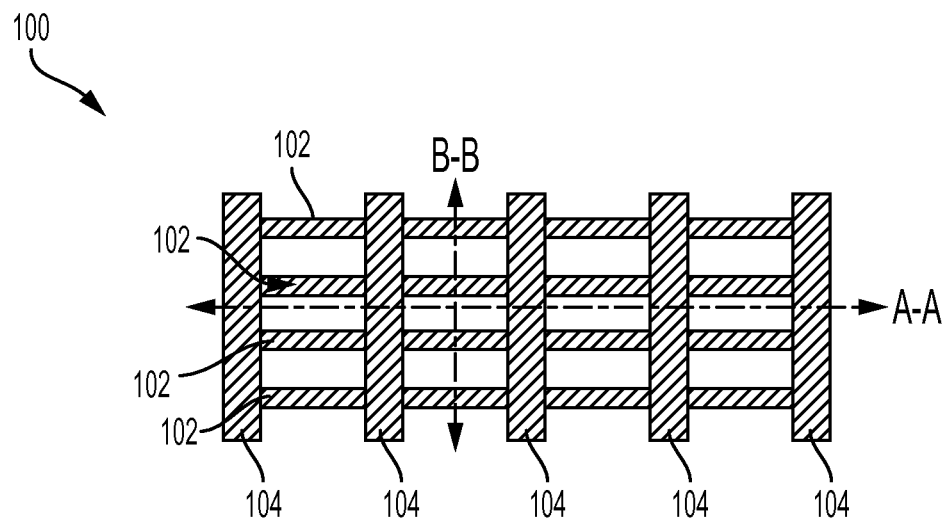
FIG. 1 is a top down view of a field-effect transistor (FET) structure at a starting point for a method in accordance with an embodiment of the present invention.

As stated above, the present invention relates to MOSFETs, and particularly to integrated capacitor technology, which are now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Capacitance of integrated FinFET capacitors can be improved by increasing the surface area available for capacitance. Moreover, in some aspects of FinFET capacitors, it may be advantageous to increase the surface area of the capacitor without increasing the lateral footprint of the capacitor. As is disclosed herein, this can be achieved by, for example, creating capacitors that are integrated in a source/drain (S/D) region. As such, in some aspects a ground contact can form one electrode while a gate and fins form the other electrode of the integrated capacitor. Furthermore as is disclosed herein, increasing the surface area—in some non-limiting aspects—can be achieved by recessing an insulator layer, such as a Shallow Trench Isolation (STI) oxide layer. By recessing the insulator layer surface area of the integrated capacitor can be increased.

Turning now to the figures, FIG. 1 is a top down view of a field-effect transistor (FET) structure 100 at a starting point for a method in accordance with an embodiment of the present invention. As will be appreciated by one of ordinary skill in the art, technically the structure 100 is not a FET in this case since, as will be discussed below, it is converted to a capacitor structure. The fin/gate array, however, is similar to that of a FET structure at this stage in the process flow. As used herein, the structure 100 is called a FET structure 100 for simplicity. Specifically, the FET structure 100 comprises a fin structure 102 that is patterned in a substrate (not shown) and gate stack structures 104. In some embodiments, such as those shown in FIGS. 1-7, the gate stack structure 104 is a replacement metal gate (RMG) with a self-aligned contact (SAC) cap. As is shown in FIGS. 2A-12, methods—including but not limited to a variety of masking and etching steps—can be used to produce an integrated FinFET capacitor having increased vertical surface area on the semiconductor structure 100.

Figure 2A:
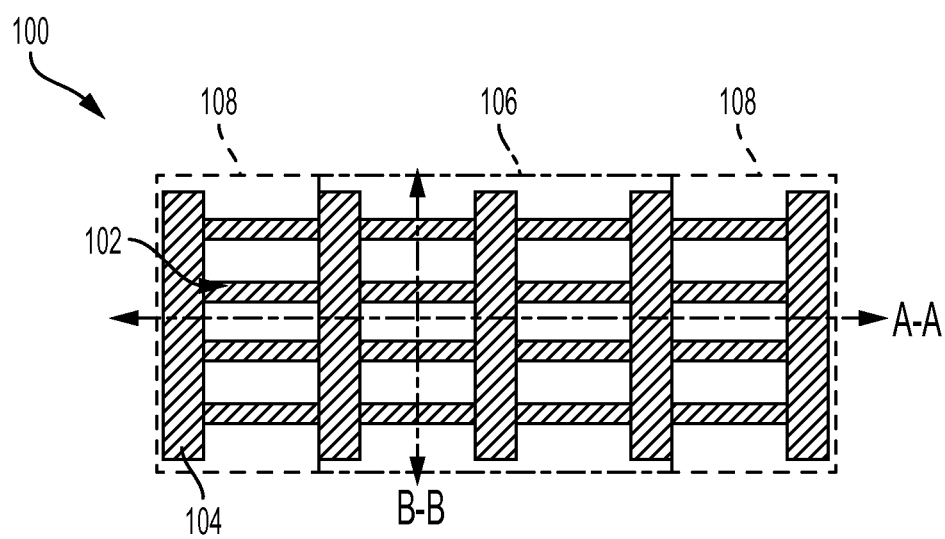
FIG. 2A is a top down view of the FET structure of FIG. 1 having a fin structure that is patterned in a substrate and a replacement metal gate (RMG) with a self-aligned contact (SAC) cap.

FIG. 2A is a top down view of the FET structure 100 having a fin structure 102 that is patterned in a substrate (not shown) and a replacement metal gate (RMG) with a self-aligned contact (SAC) cap 104. In the embodiment shown in FIG. 2, the field-effect transistor structure 100 can be masked in preparation for forming a capacitor region 106 and a non-capacitor region 108. As shown, the capacitor region 106 comprises gate stack structures 104c and fins 102c. As shown, forming a non-capacitor region 108 and a capacitor region 106 on the field-effect transistor structure can be achieved by masking portions of the FET structure with a mask such that a non-capacitor region 108 is masked and a capacitor region 106 is exposed.

As described, in exemplary embodiments, the mask only covers the non-capacitor regions 108 thus leaving the desired capacitor region exposed. In some aspects, the mask can be any suitable mask and in some non-limiting aspects can be patterned on the field-effect transistor. For example, in some aspects exemplary masks can include photoresist stacks which additionally can include bottom anti-reflective coating (BARC) or photosensitive developer-soluble bottom anti-reflective coating (PS-DBARC), (silicon containing) organic spin-on films, and/or amorphous carbon. The mask can be formed by suitable masking techniques, such as photolithographic deposition and patterning.

Figure 2B:
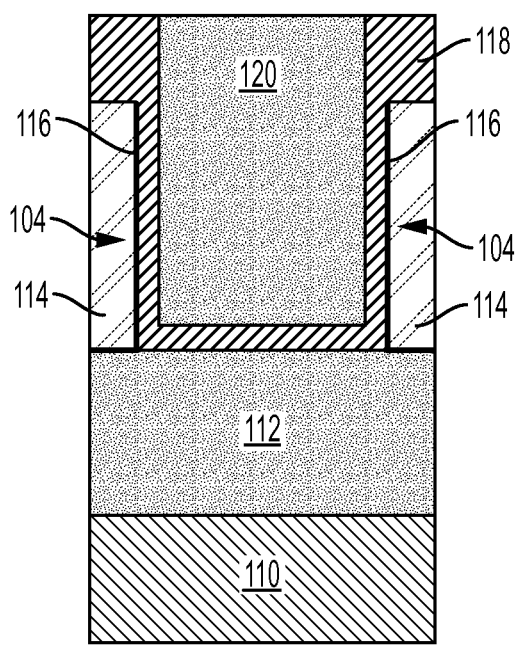
FIG. 2B is a cross-sectional view of the FET structure of FIG. 1 cut along line A-A and viewed within the capacitor region.
Figure 2C:
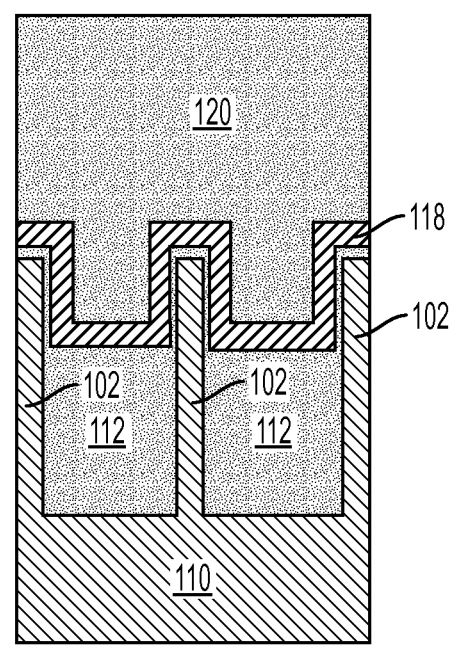
FIG. 2C is a cross-sectional view of the field-effect transistor 100 cut along line B-B within the capacitor region.

FIG. 2B is a cross-sectional view of the FET 100 cut along line A-A and viewed within the capacitor region 106. FIG. 2C is a cross-sectional view of the field-effect transistor 100 cut along line B-B within the capacitor region 106. As shown, the field-effect transistor 100 includes a substrate 110 with an insulator layer 112 formed above the substrate 110. The FET structure 100 also includes a gate stack structure 104 that has replacement metal gates 114 and a high-k layer 116. Furthermore, the FET structure 100 includes a hardmask and spacer 118 disposed above the gates 104 and the insulator layer 112. Additionally, fin structures 102 are patterned and etched into the substrate 110 and separated by shallow trench isolation (STI) insulator regions 112. Furthermore, the FET structure 100 can have an insulator layer 120 disposed above the hardmask 118.

Any suitable materials for the layers and/or components described—such as the substrate 110, fins 102, insulator layers 112, hardmask layers 118, replacement metal gates 114, high-k layers 116—can be used in accordance with the teachings herein.

Non-limiting examples of suitable bulk substrate materials include silicon, silicon dioxide, aluminum oxide, sapphire, germanium, gallium arsenide (GaAs), an alloy of silicon and germanium, indium phosphide (InP), or any combination thereof. The thickness of the substrate is not intended to be limited. In one aspect, the thickness of the substrate is in a range from about 5 nanometers (nm) to about 300 nanometers (nm). In another aspect, the thickness of the substrate is in a range from about 15 nanometers (nm) to about 100 nanometers (nm).

The fins 102 can be patterned of the same material as the substrate 110 or can be formed of differing substrate materials. Additionally, the fin structures 102 can be doped to form active regions by any suitable process such as, for example, an ion implantation and annealing process, or an epitaxial growth process.

Non-limiting examples of suitable insulator materials include Shallow Trench Insulator (STI) oxides such as silicon oxide, silicon dioxide. Non-limiting examples of suitable hardmask materials can include silicon nitride (SiN), SiOCN, or SiBCN.

In some aspects, the gate stack 104 includes high-k metal gates 116 formed, for example, by filling a dummy gate opening (not shown) with one or more high-k dielectric materials, one or more work function metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. The high-k material may further include dopants such as, for example, lanthanum and aluminum. The high-k dielectric material layer 116 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material 116 may vary depending on the deposition process as well as the composition and number of high-k dielectric materials used. The high-k dielectric material layer 116 may have a thickness in a range from about 0.5 nanometers (nm) to about 20 nanometers (nm). In some aspects, the high-k dielectric material layer 116 may have a thickness in a range from about 0.5 nanometers (nm) to about 5 nanometers (nm).

In some aspects, the gate stack structure 104 can include a work function metal(s) that may be disposed over the high-k dielectric material. The type of work function metal(s) depends on the type of transistor and may differ. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A gate metal 114 can also be deposited over the high-k dielectric material(s) and workfunction layer(s) to form the gate stacks 110. Non-limiting examples of suitable conductive, gate metals include aluminum, platinum, gold, tungsten, titanium, or any combination thereof. The gate metal may be deposited by a variety of deposition processes, for example, CVD, PECVD, PVD, plating, thermal or e-beam evaporation, sputtering, or sputtering.

As described, in some embodiments, the fin structure 102 is patterned in the substrate 110 to form the FET structure 100. The gate stack 104 can be disposed over and around the fin structure 102. Further, in some embodiments, the devices formed by the disclosed processes are planar devices or gate-all-around devices. In some embodiments, the gate stack may further comprise a dielectric cap layer (not shown) on top of the gate stack 104.

In some aspects, active regions can be formed on opposing sides of the gate stacks 104. To form the active regions, an epitaxial growth process may be performed to deposit a crystalline layer onto the crystalline substrate. The epitaxial silicon, silicon germanium, and/or carbon doped silicon (Si:C) can be doped during deposition by adding a dopant or impurity to form a silicide. The epitaxial source/drain may be doped with an n-type dopant or a p-type dopant, which depends on the type of transistor. Alternatively, the active regions can be formed by incorporating dopants into the substrate.

Any suitable gate formation techniques may be employed. For example, in one aspect a gate first process is utilized. In such a gate first process, a gate dielectric layer—such as a high-k layer—can be deposited along the surface of the FET structure 100, including over the revealed fins and STI oxide layer. Gate metal can then be deposited on the high-k layer to form the gate regions. After the gate metal is deposited, a photolithographic patterning and etching process such as, for example, reactive ion etching (RIE) is performed to pattern the gate stack. Subsequently, a spacer is formed by, for example, depositing a layer of nitride or oxide material and performing an anisotropic etching process to define the spacer along sidewalls of the gate stack. Following the formation of the spacers active regions may be formed from the fins by a suitable process. In one embodiment, an epitaxial growth process may be performed that grows a semiconductor material from exposed portions of the fins. Following the epitaxial growth process, ion implantation and annealing may be performed to diffuse dopants into the fins. In other embodiments, the dopants may be added in-situ during the epitaxial growth process.

In an alternative exemplary embodiment, the FET devices may be formed using a gate last process. In such a process, following the formation of the fins and the PTS, a layer of dummy gate material, such as, for example, a polysilicon material and a layer of hard mask material is deposited over the fins. A photolithographic masking and etching process such as, for example, RIE is performed to pattern dummy gate stacks. Following the formation of the dummy gate stacks, a spacer material layer is deposited and etched to form spacers adjacent to the sidewalls of the dummy gate stack. The fins may be doped to form active regions by any suitable process such as, for example, an ion implantation and annealing process, or an epitaxial growth process. After the active regions are formed, an insulator layer, such as, for example, an oxide layer may be disposed and planarized to expose the dummy gate stacks. The dummy gate stacks are removed, and replaced with replacement metal gate materials.

As described, the FET structure 100 can be masked to create a non-capacitor region 108 and capacitor region 106. Once masked, the capacitor region can be further processed to optimize the capacitance of the integrated capacitor.

Figure 3A:
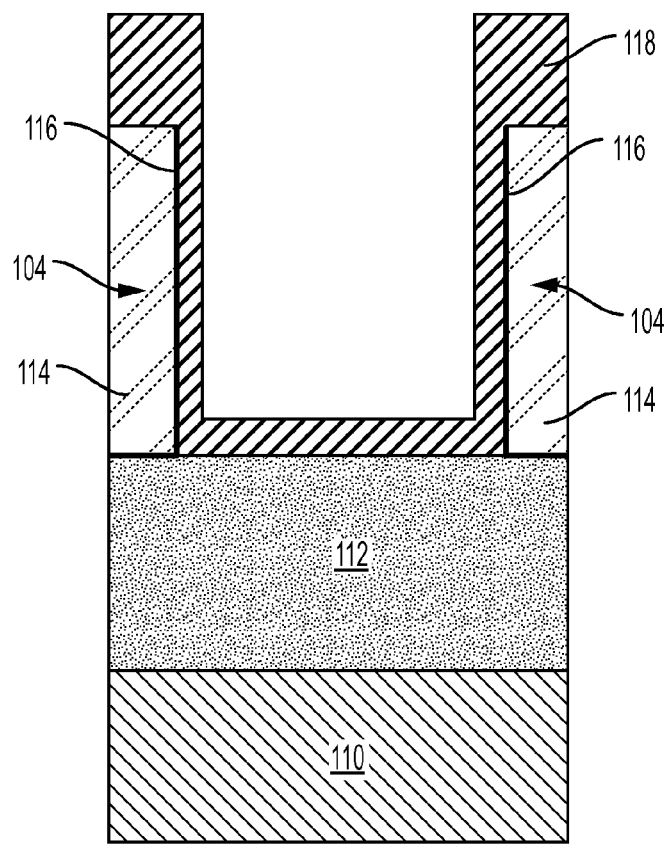
FIG. 3A is a cross-sectional view of the FET structure of FIG. 1 cut along line A-A and viewed within the capacitor region having the insulator layer removed.
Figure 3B:
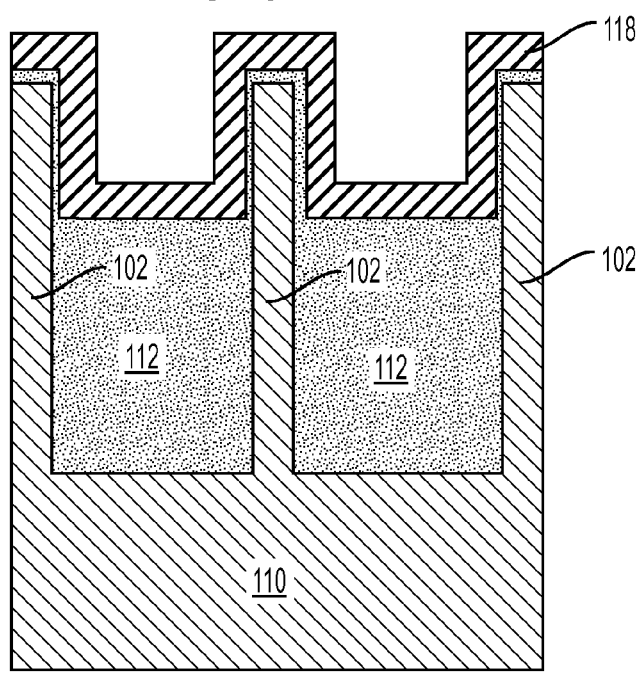
FIG. 3B is a cross-sectional view of the FET structure of FIG. 1 cut along line B-B within the capacitor region having the insulator layer removed.

FIG. 3A is a cross-sectional view of the FET 100 cut along line A-A and viewed within the capacitor region 106 having the insulator layer 120 removed. FIG. 3B is a cross-sectional view of the field-effect transistor 100 cut along line B-B within the capacitor region 106 having the insulator layer 120 removed. Specifically, the FET structure 100 can be etched selectively to the mask and the hardmask 118 to remove the insulator layer 120. Example masks can include a buffered HF (wet etch) or reactive ion etching (RIE) using fluorocarbon etch gases such as $CF_4$, $CHF_3$, $CH_3F$, and/or $C_4F_8$.

Figure 4A:
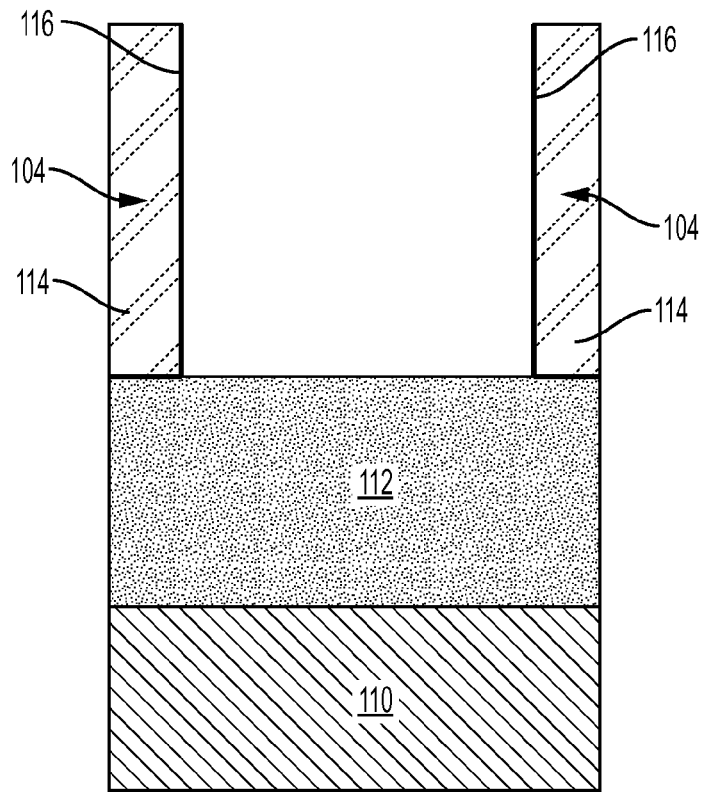
FIG. 4A is a cross-sectional view of the FET structure of FIG. 1 cut along line A-A and viewed within the capacitor region having the hardmask layer removed.
Figure 4B:
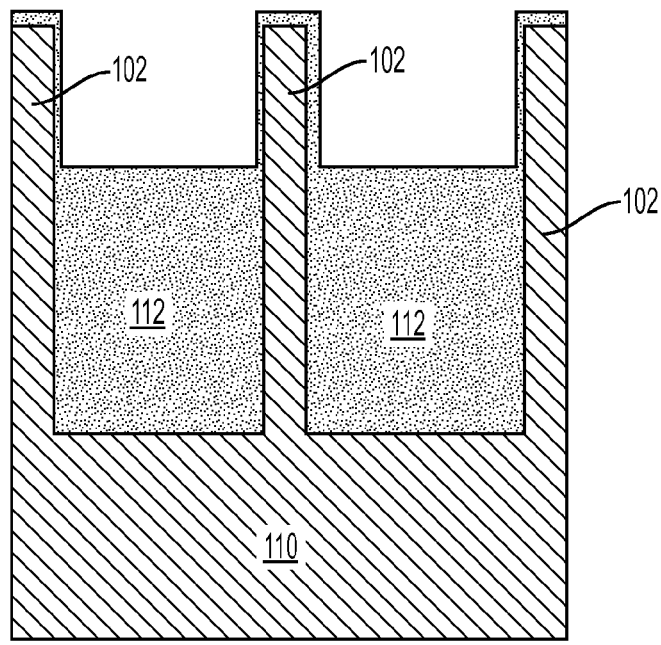
FIG. 4B is a cross-sectional view of the FET structure of FIG. 1 cut along line B-B within the capacitor region having the hardmask layer removed.

FIG. 4A is a cross-sectional view of the FET 100 cut along line A-A and viewed within the capacitor region 106 having the hardmask layer 118 removed. FIG. 4B is a cross-sectional view of the field-effect transistor 100 cut along line B-B within the capacitor region 106 having the hardmask layer 118 removed. As shown, the FET structure 100 can be etched selectively to the gate stack structure, insulator layer, and mask to remove the hardmask layer 118. Example etching processes can include using RIE, which can include $CH_4$, $CHF_3$, or $CH_2F_2$.

Figure 5A:
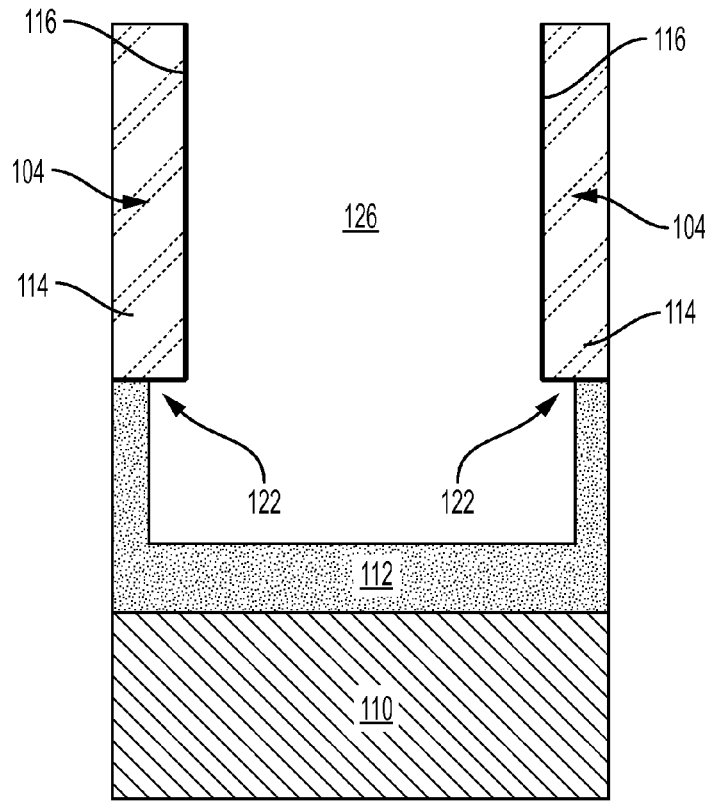
FIG. 5A is a cross-sectional view of the FET structure of FIG. 1 cut along line A-A and viewed within the capacitor region having the insulator region recessed such that a gate overhang recess is formed.
Figure 5B:
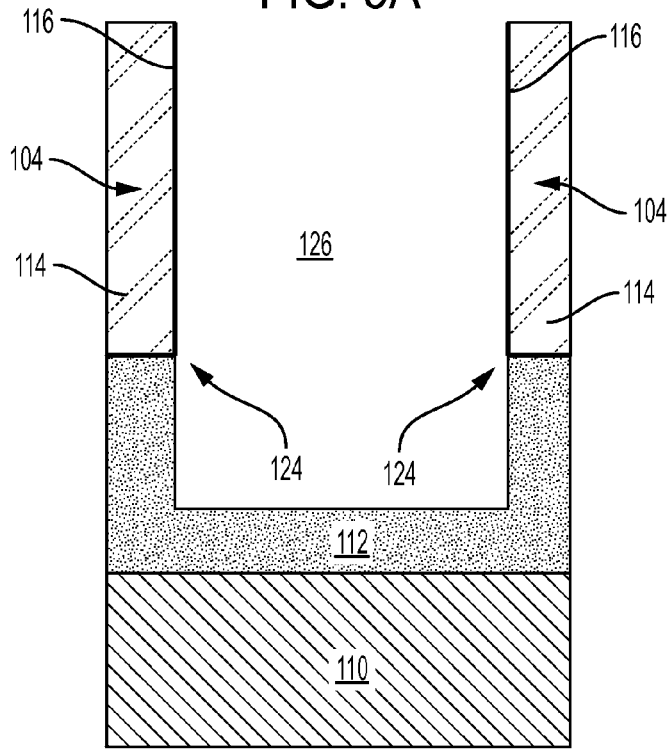
FIG. 5B is a cross-sectional view of the FET structure of FIG. 1 cut along line A-A within the capacitor region having the insulator region recessed without a recess at the junction between the gate stack and the remaining insulator.
Figure 5C:
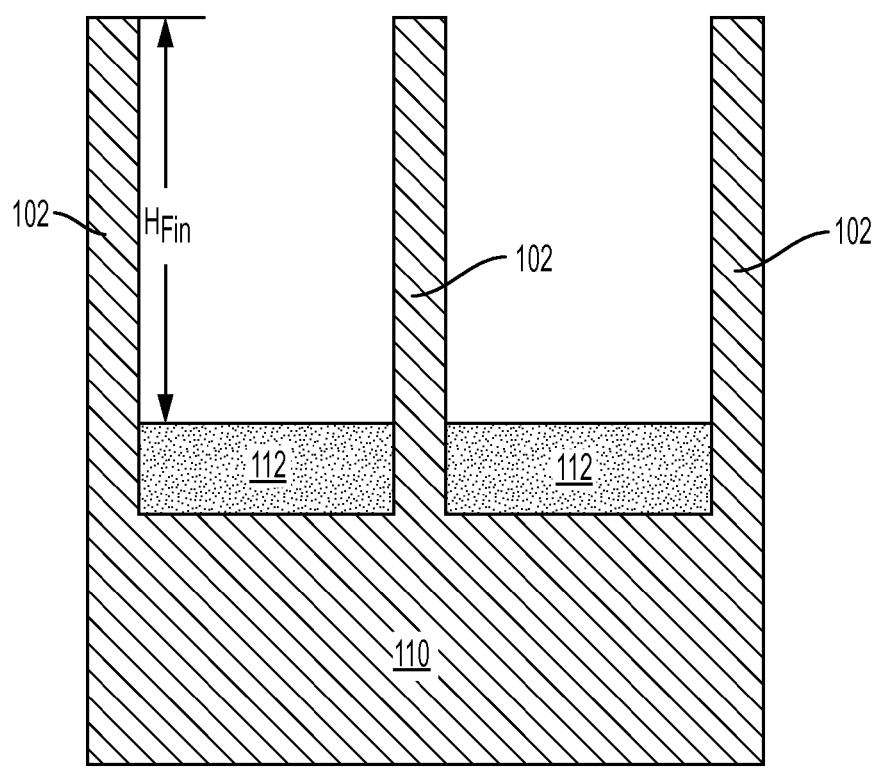
FIG. 5C is a cross-sectional view of the FET structure of FIG. 1 cut along line B-B within the capacitor region having the insulator region recessed.

FIG. 5A is a cross-sectional view of the FET 100 cut along line A-A and viewed within the capacitor region 106 having the insulator region 112 recessed such that a gate overhang recess 122 is formed. FIG. 5B is a cross-sectional view of the field-effect transistor 100 cut along line A-A within the capacitor region 106 having the insulator region 112 recessed without a recess at the junction 124 between the gate stack 104 and the remaining insulator 112. FIG. 5C is a cross-sectional view of the field-effect transistor 100 cut along line B-B within the capacitor region 106 having the insulator region 112 recessed. As shown in FIGS. 5A-5C, the insulator layer 112 can be recessed to remove a portion of the insulator layer 112 thus exposing, i.e., revealing, more of the underlying fins and/or creating a larger trench 126 between the gate stack structures 104 forming the capacitor region 106. As shown in FIG. 5C, by recessing the insulator layer 112 the revealed height $H_{fin}$ of the fin structure 102 is increased relative to the revealed height of the starting fin structure, which is the same as the revealed height of the fin structure in the non-capacitor region 108. As used herein, "revealed height" means the distance from a top surface of the fin structure to a top surface of the insulator layer 112, if any, such as is shown in FIG. 5C. Therefore, the revealed height $H_{fin}$ of the fin structure 102 of the capacitor region 106 is greater than a revealed height of the fin structure in the non-capacitor region. In some embodiments, the fins in the capacitor region can have a revealed height $H_{fin}$ between about 30 nanometers (nm) and 300 nanometers (nm). In some embodiments, the fins in the capacitor region can have a height $H_{fin}$ between about 35 nanometers (nm) and 100 nanometers (nm). The insulator region 112 can be removed by any suitable process such as etching.

Figure 6A:
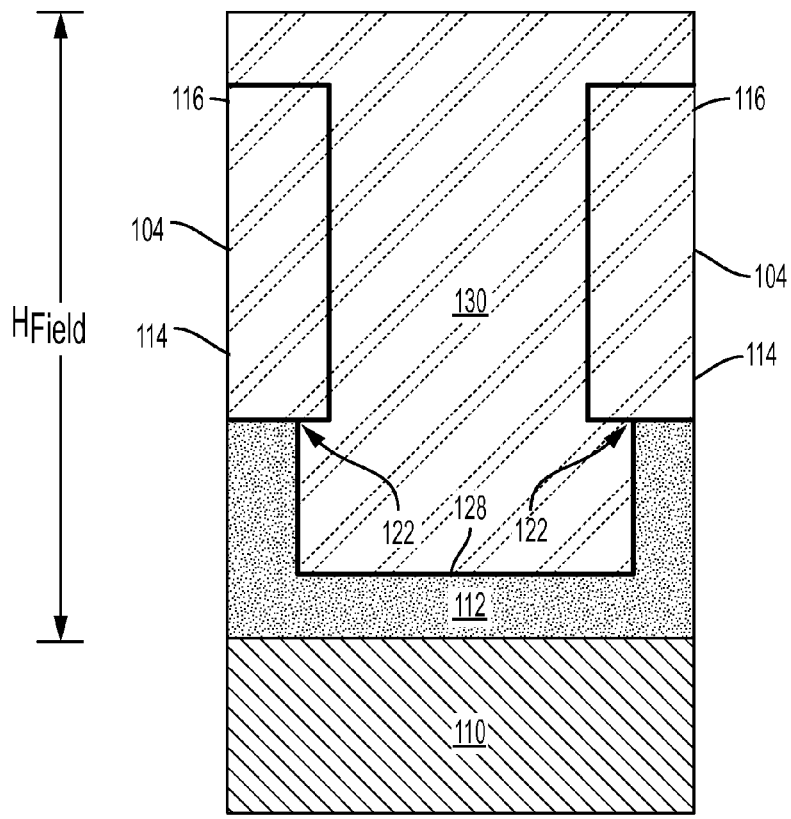
FIG. 6A is a cross-sectional view of the FET structure of FIG. 1 cut along line A-A and viewed within the capacitor region having the trench filled with a high-k layer and a conductive metal layer.
Figure 6B:
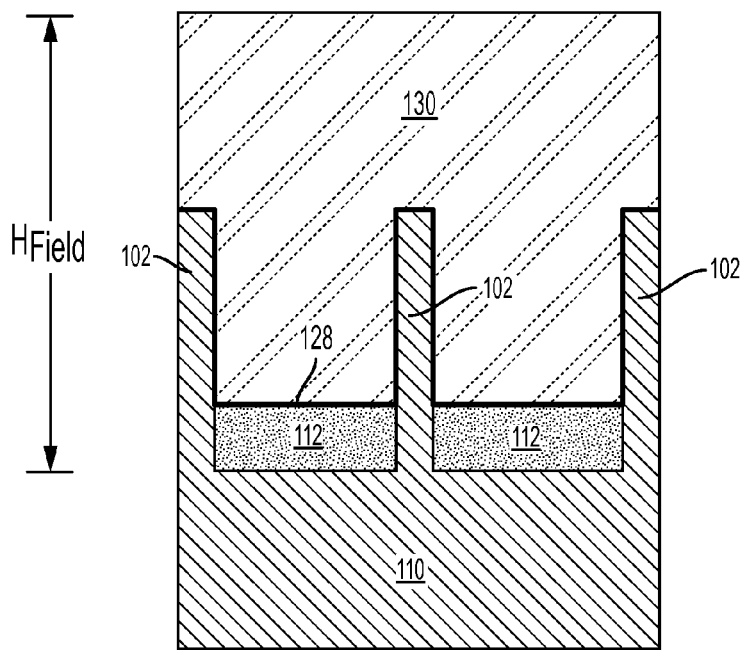
FIG. 6B is a cross-sectional view of the FET structure of FIG. 1 cut along line B-B within the capacitor region filled with a high-k layer and a conductive metal.

FIG. 6A is a cross-sectional view of the FET 100 cut along line A-A and viewed within the capacitor region 106 having the trench 126 filled with a high-k layer 128 and a conductive metal layer 130. FIG. 6B is a cross-sectional view of the field-effect transistor 100 cut along line B-B within the capacitor region 106 filled with a high-k layer 128 and a conductive metal 130.

As shown, first a high-k layer 128 can be deposited within the capacitor region 106 such that the high-k layer 128 is disposed over the remaining insulator layer 112 as well as the fin structure 102 and the gate stack structure 104. As shown in FIG. 6A, the gate overhang recess 122 can be coated by the high-k material. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. The high-k material may further include dopants such as, for example, lanthanum and aluminum. The high-k dielectric material layer 128 may be formed by any suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material 128 may vary depending on the deposition process as well as the composition and number of high-k dielectric materials used. In some aspects, the high-k dielectric material layer 128 may have a thickness in a range from about 0.5 nanometers (nm) to about 20 nanometers (nm). In some aspects, the high-k dielectric material layer 128 may have a thickness in a range from about 0.5 nanometers (nm) to about 5 nanometers (nm).

Once the high-k layer 128 is deposited, a conductive metal layer 130 can be deposited onto the capacitor region 106.

Non-limiting examples of suitable conductive metals include aluminum, platinum, gold, tungsten, titanium, titanium nitride (TiN), tantalum nitride (TaN), tantalum, cobalt, copper, and/or any combination thereof. The conductive metal may be deposited by any suitable deposition process, for example, CVD, PECVD, PVD, plating, thermal or e-beam evaporation, sputtering, or sputtering. Furthermore, the FET structure 100 having the conductive metal layer 130 disposed over the capacitor region 106 can be planarized to create a desired field height $H_{field}$. In some embodiments, the field height $H_{field}$ can be between about 50 nanometers (nm) and 500 nanometers (nm). In some embodiments, the field height $H_{field}$ can be between about 100 nanometers (nm) and 300 nanometers (nm). Planarization techniques can include any suitable planarization method, such as chemical mechanical planarization.

Figure 7:
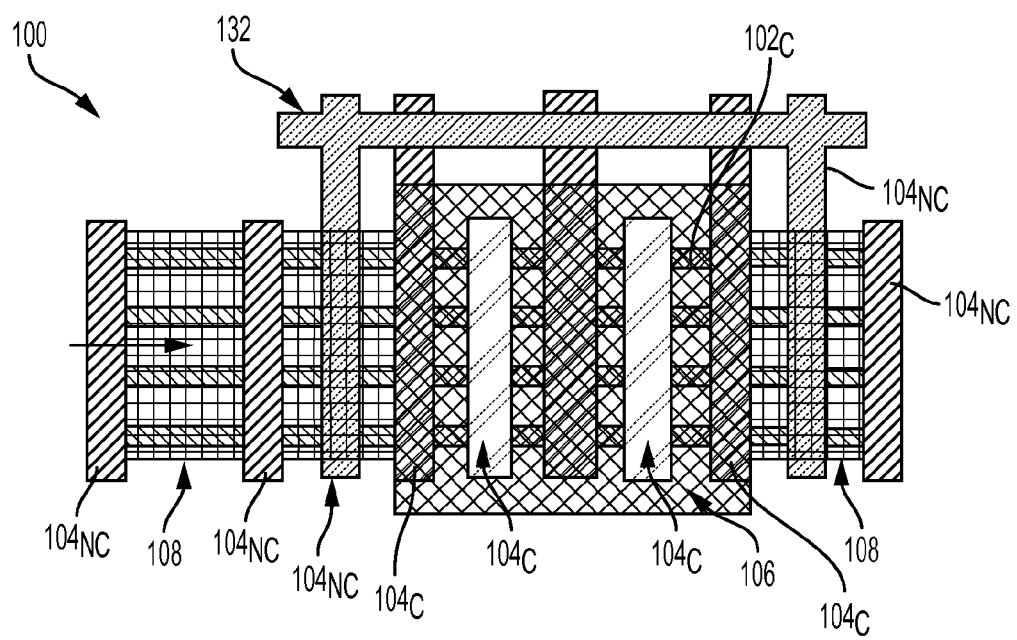
FIG. 7 is a top down view of the FET structure following the processing outlined in FIGS. 2A-6B.

FIG. 7 is a top down view of the FET structure 100 following the processing outlined in FIGS. 2A-6B. As shown, the capacitor region 106 comprises a portion of the fin structure, gate stack structure, and insulator layer such that the fin structure forming the capacitor region has a recessed insulator layer relative to the insulator layer of the non-capacitor region. Specifically, the capacitor region 106 comprises gate stacks $104_C$ having the recessed trench 126 and fin structure $102_C$ as described above in FIGS. 2A-6B. Additionally as shown the FET structure can have a ground 132 proximate to the gate stack structures $104_C$. Furthermore, the structure 100 can include bar contact landings $104_{NC}$ between the gates on the fins below. In some aspects, the fins 102 could have epi-growth on them to provide a low resistance path between that bar contact $104_{NC}$ and the fins 102. These vertical bar contacts $104_{NC}$ overlap with the horizontal bar contact (132) and therefore have a similar potential. As such, the fins 102 below and the gates 104 can be grounded together. Additionally, as shown the capacitor region fins $102_C$ and the capacitor region gate stack structures $104_C$ are connected and act as one electrode of the capacitor. The ground 132 can function as another electrode for the capacitor. It is further appreciated that following the formation of the gates and/or grounds, conductive contacts may be formed by, for example, etching vias in the insulator layer to expose the active regions of the devices, and depositing conductive material in the vias (not shown).

Figure 8:
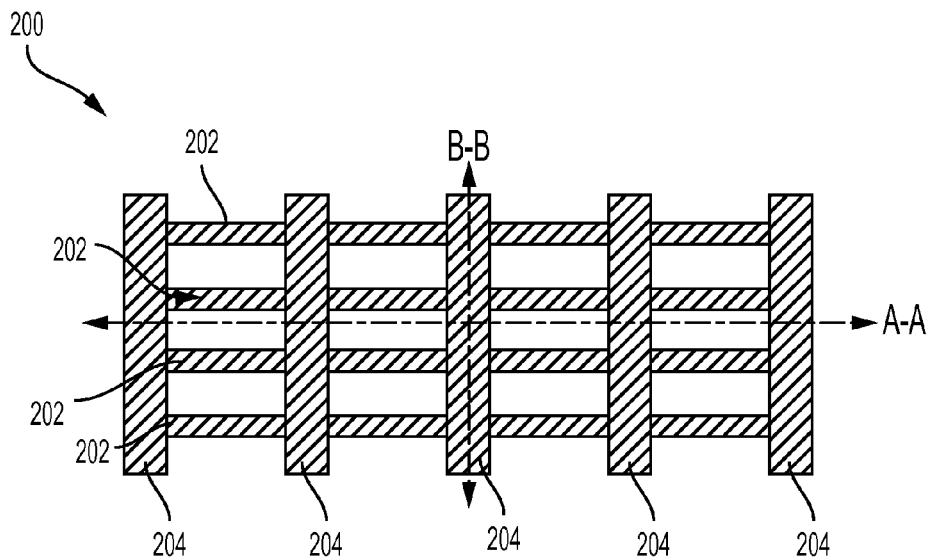
FIG. 8 is a top down view of a field-effect transistor (FET) structure at a starting point for a method in accordance with another embodiment of the present invention.

FIG. 8 is a top down view of a field-effect transistor (FET) structure 200 at a starting point for a method in accordance with another embodiment of the present invention. Specifically, the FET structure 200 comprises a fin structure 202 that is patterned in a substrate (not shown) and high-k/workfunction metal stack structures 204 (sometimes referred to below as a "gate"). In some embodiments, such as those shown in FIGS. 9A-12, the high-k/workfunction metal stack structure 204 is a pulled dummy gate prior to addition of replacement metal gate (RMG) metal. As is shown in FIGS. 9A-12, methods—including but not limited to a variety of masking and etching steps—can be used to produce an integrated FinFET capacitor having increased vertical surface area on the semiconductor structure 200.

Figure 9A:
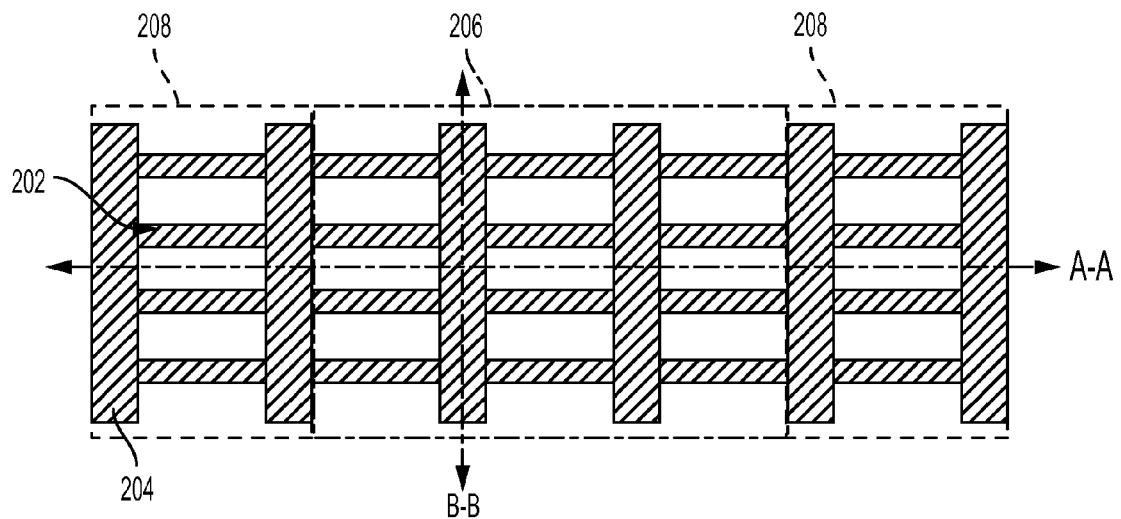
FIG. 9A is a top down view of the FET structure of FIG. 8 having a fin structure that is patterned in a substrate and gate stack structure with a pulled dummy gate.

FIG. 9A is a top down view of the FET structure 200 having a fin structure 202 that is patterned in a substrate (not shown) and high-k/workfunction metal stack structure 204 with a pulled dummy gate. As shown, the field-effect transistor structure 200 can be masked in preparation for forming a capacitor region 206 and a non-capacitor region 208. As shown, the capacitor region 206 comprises high-k/workfunction metal stack structures 204 and fins 202. As shown, forming a non-capacitor region 208 and a capacitor region 206 on the field-effect transistor structure can be achieved by masking portions of the FET structure with a mask such that a non-capacitor region 208 is masked and a capacitor region 206 is exposed. In this embodiment, as will be discussed below, since the high-k/workfunction metal stack 204 in the capacitor region get their own metallization, the capacitor shape 206 can encompass the whole high-k/workfunction metal stack 204 and the gate contact can stay within the high-k/workfunction metal stack high-k/workfunction metal stack, that is the mask that forms the exposed capacitor region 206 should not straddle a high-k/workfunction metal stack at the edges of the mask.

As described, in exemplary embodiments, the mask only covers the non-capacitor regions 208 thus leaving the desired capacitor region 206 exposed. In some aspects, the mask can be any suitable mask and in some non-limiting aspects can be patterned on the field-effect transistor. For example, in some aspects exemplary masks can include photoresist stacks which additionally can include bottom anti-reflective coating (BARC) or photosensitive developer-soluble bottom anti-reflective coating (PS-DBARC), (silicon containing) organic spin-on films, and/or amorphous carbon. The mask can be formed by suitable masking techniques, such as photolithographic deposition and patterning.

Figure 9B:
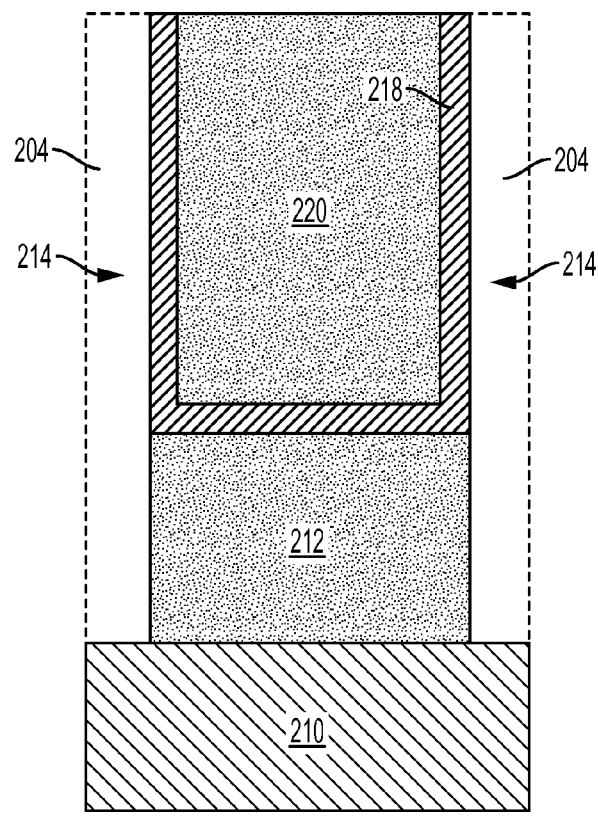
FIG. 9B is a cross-sectional view of the FET structure of FIG. 8 cut along line A-A and viewed within the capacitor region.
Figure 9C:
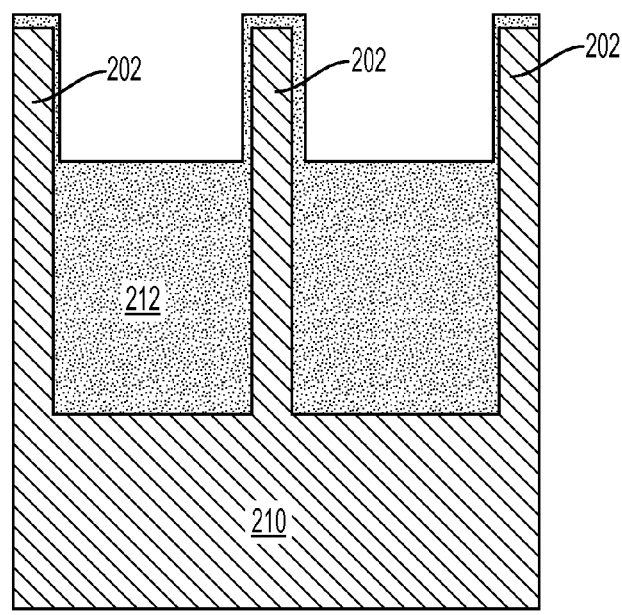
FIG. 9C is a cross-sectional view of the field-effect transistor 200 cut along line B-B within the capacitor region.

FIG. 9B is a cross-sectional view of the FET 200 cut along line A-A and viewed within the capacitor region 206. FIG. 9C is a cross-sectional view of the field-effect transistor 200 cut along line B-B within the capacitor region 206. As shown, the field-effect transistor 200 includes a substrate 210 with an insulator layer 212 formed above the substrate. The FET structure 200 also includes a high-k/workfunction metal stack structure 204 that has a space 214 where dummy gates have been pulled. As such, processing under this embodiment begins at one step prior to the processing shown in the above described embodiment shown in FIGS. 1-7, i.e., the high-k/workfunction metal stack structure 204 does not yet have the replacement gate metal as is described in regards to FIGS. 1-2C. Furthermore, the FET structure 200 includes a spacer 218 disposed above the high-k/workfunction metal stack structure 204 and the insulator layer 212. Additionally, fin structures 202 are patterned and etched into the substrate 210 and separated by shallow trench isolation (STI) insulator regions 212. Furthermore, the FET structure 200 can have an insulator layer 220 disposed above the spacer 218.

Any suitable materials for the layers and/or components described—such as the substrate 210, fins 202, insulator layers 212, 220, and spacer layers 218—can be used in accordance with the teachings herein.

Non-limiting examples of suitable bulk substrate materials include silicon, silicon dioxide, aluminum oxide, sapphire, germanium, gallium arsenide (GaAs), an alloy of silicon and germanium, indium phosphide (InP), or any combination thereof. The thickness of the substrate is not intended to be limited. In one aspect, the thickness of the substrate is in a range from about 5 nanometers (nm) to about 300 nanometers (nm). In another aspect, the thickness of the substrate is in a range from about 15 nanometers (nm) to about 100 nanometers (nm).

The fin structure 202 can be patterned of the same material as the substrate 210 or can be formed of differing substrate materials. Additionally, the fin structures 202 can be doped to form active regions by any suitable process such as, for example, an ion implantation and annealing process, or an epitaxial growth process.

Non-limiting examples of suitable insulator materials include Shallow Trench Insulator (STI) oxides such as silicon oxide, silicon dioxide. Non-limiting examples of suitable hardmask materials can include silicon nitride (SiN), SiOCN, or SiBCN.

Figure 10A:
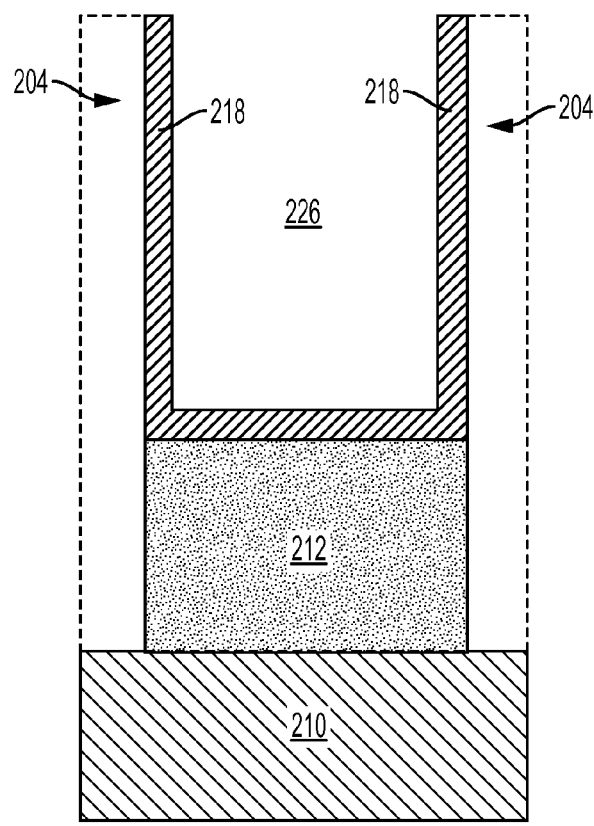
FIG. 10A is a cross-sectional view of the FET structure of FIG. 8 cut along line A-A and viewed within the capacitor region having the insulator layer removed.
Figure 10B:
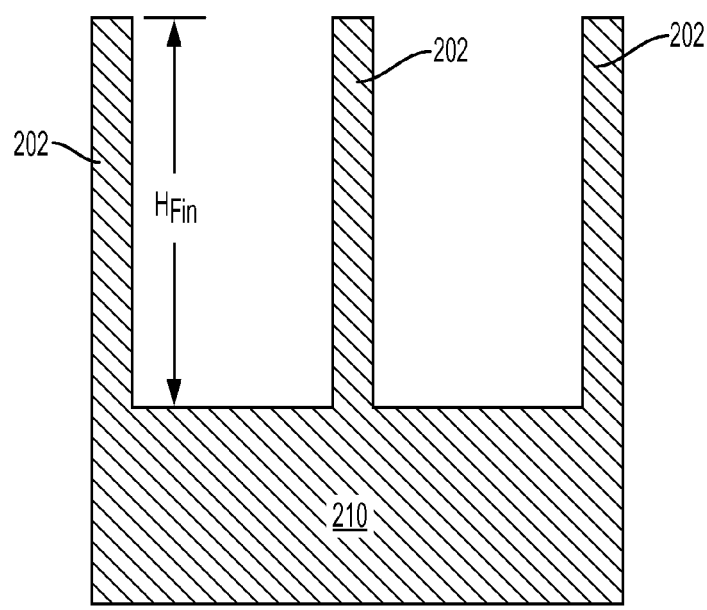
FIG. 10B is a cross-sectional view of the FET structure of FIG. 8 cut along line B-B within the capacitor region having the insulator layer removed.

FIG. 10A is a cross-sectional view of the FET structure 200 cut along line A-A and viewed within the capacitor region 206 having the insulator layer 220 removed. FIG. 10B is a cross-sectional view of the FET structure 200 cut along line B-B within the capacitor region 206 having the insulator layer 220 removed. Specifically, the FET structure 200 can be etched selectively to the mask and the spacer 218 and/or the substrate to remove the insulator layer 220 and insulator layer 212 disposed over the fin structure 202. By removing the insulator layer 220, a trench 226 is created between the high-k/workfunction metal stack structures 204. Moreover, the insulator layer 212 may be etched such that it undercuts the active region creating a gate overhang recess as is described with respect to FIG. 5A.

Moreover, by recessing and/or removing the insulator layer 212 the revealed height $H_{fin}$ of the fin structure 202 is increased relative to the revealed height of the starting fin structure, which is the same as the revealed height of the fin structure in the non-capacitor region 208. Therefore, the revealed height $H_{fin}$ of the fin structure 202 of the capacitor region 206 is greater than a revealed height of the fin structure in the non-capacitor region. In some embodiments, the fin structure 202 in the capacitor region can have a revealed height $H_{fin}$ between about 30 nanometers (nm) and 300 nanometers (nm). In some embodiments, the fin structure 202 in the capacitor region can have a revealed height $H_{fin}$ between about 35 nanometers (nm) and 100 nanometers (nm). The insulator region 212 can be removed by any suitable process such as etching.

Figure 11A:
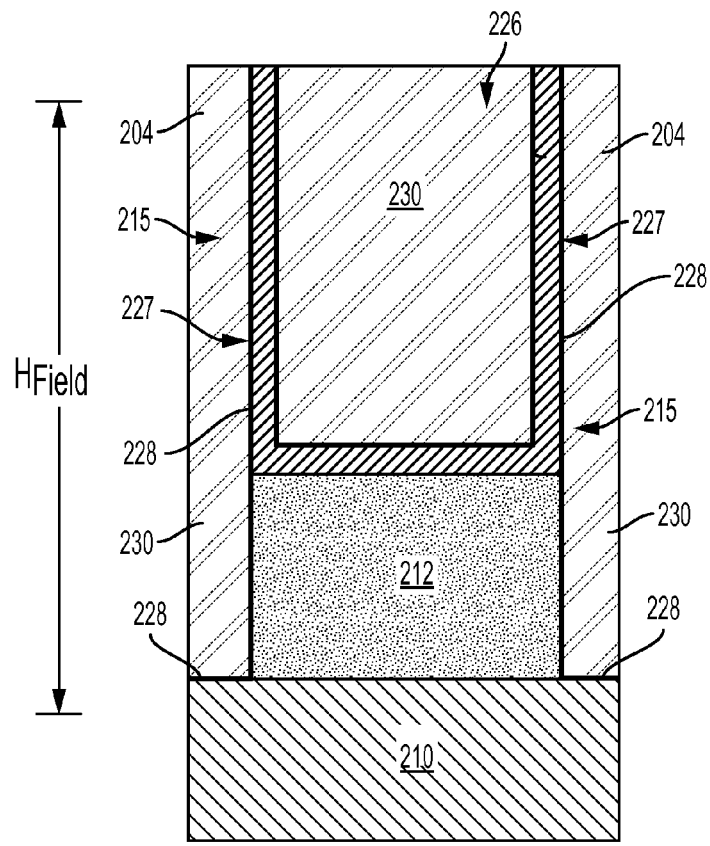
FIG. 11A is a cross-sectional view of the FET structure of FIG. 8 cut along line A-A and viewed within the capacitor region having the trench and an inner surface of the gate stack structure filled with a high-k layer and a conductive metal layer.
Figure 11B:
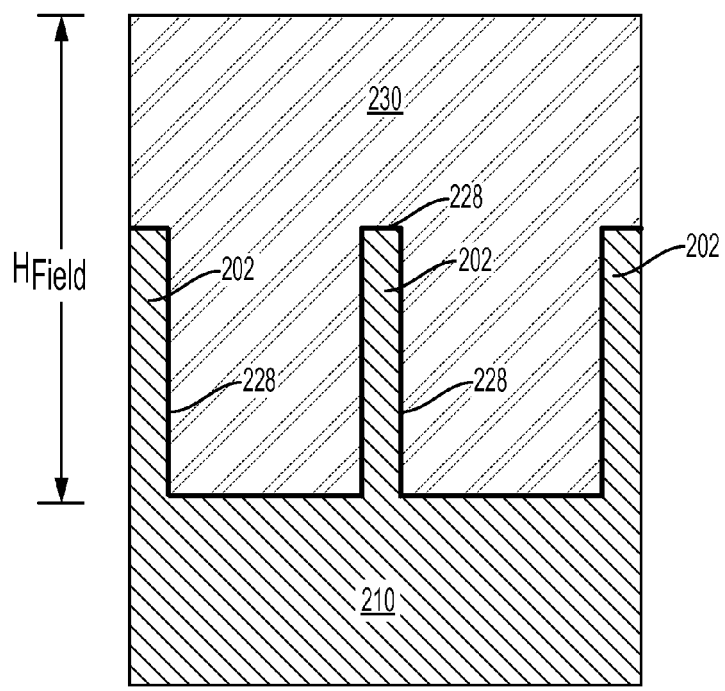
FIG. 11B is a cross-sectional view of the FET structure of FIG. 8 cut along line B-B and viewed within the capacitor region having the recessed fin structure filled with a high-k layer and a conductive metal layer.

FIG. 11A is a cross-sectional view of the FET structure 200 cut along line A-A and viewed within the capacitor region 206 having the trench 226 and an inner surface 227 of the high-k/workfunction metal stack structure 204 filled with a high-k layer 228 and a conductive metal layer 230. As shown, the conductive metal layer 230 additionally forms the replacement gate metal 215 to form fully form the high-k/workfunction metal stack structure 204. FIG. 11B is a cross-sectional view of the field-effect transistor 200 cut along line B-B within the capacitor region 206 filled with a high-k layer 228 and a conductive metal 230. As shown, when the capacitor region 206 is filled with the conductive metal 230, the fin structure 202 is filled with the metal 230. Also, as shown, prior to filling the capacitor region 206 with the conductive metal, a high-k layer 228 can be deposited throughout the capacitor region 206.

As shown, first a high-k layer 228 can be deposited within the capacitor region 206 such that the high-k layer 228 is disposed over the remaining insulator layer 212 as well as the fin structure 202 and the high-k/workfunction metal stack structure 204. In some embodiments, the high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. The high-k material may further include dopants such as, for example, lanthanum and aluminum. The high-k dielectric material layer 228 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material 228 may vary depending on the deposition process as well as the composition and number of high-k dielectric materials used. The high-k dielectric material layer 228 may have a thickness in a range from about 0.5 nanometers (nm) to about 20 nanometers (nm). In some aspects, the high-k dielectric material layer 228 may have a thickness in a range from about 0.5 nanometers (nm) to about 5 nanometers (nm).

Once the high-k layer 228 is deposited, a conductive metal layer 230 can be deposited onto the capacitor region 206. Non-limiting examples of suitable conductive metals include aluminum, platinum, gold, tungsten, titanium, or any combination thereof. The conductive metal may be deposited by any suitable deposition process, for example, CVD, PECVD, PVD, plating, thermal or e-beam evaporation, sputtering, or sputtering. Furthermore, the FET structure 200 having the conductive metal layer 230 disposed over the capacitor region 206 can be planarized to create a desired field height $H_{field}$. In some embodiments, the field height $H_{field}$ can be between about 5 nanometers (nm) and 500 nanometers (nm). In some embodiments, the field height $H_{field}$ can be between about 100 nanometers (nm) and 300 nanometers (nm). Planarization techniques can include any suitable planarization method, such as chemical mechanical planarization.

Figure 12:
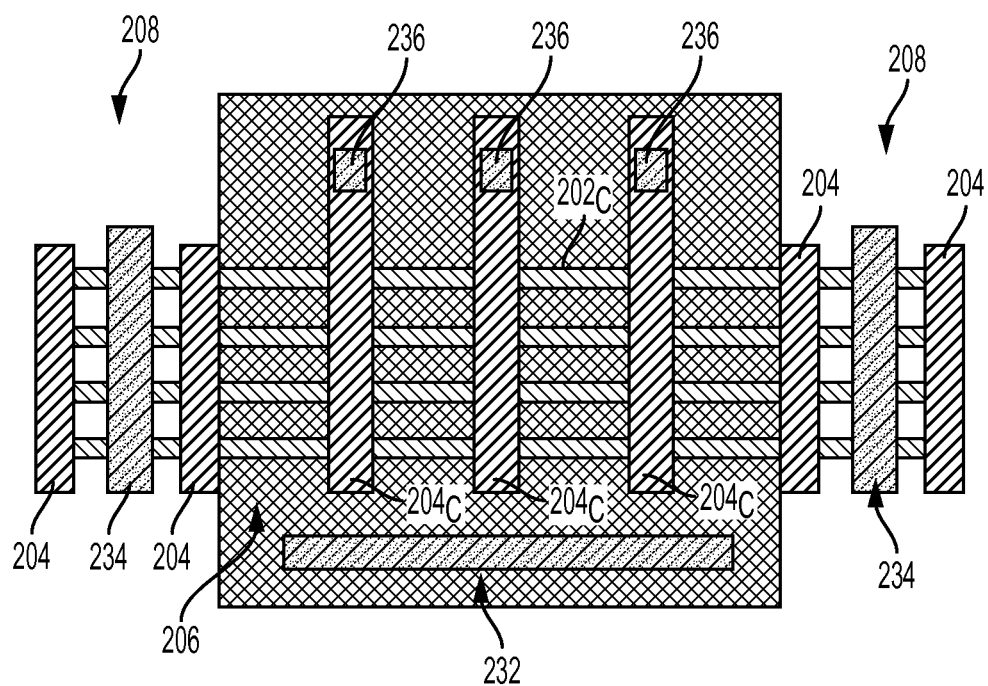
FIG. 12 is a top down view of the FET structure of FIG. 8 following the processing outlined in FIGS. 9A-11B.

FIG. 12 is a top down view of the FET structure 200 following the processing outlined in FIGS. 9A-11B. As shown, the capacitor region 206 comprises a portion of the fin structure, gate stack structure, and insulator layer such that the fin structure forming the capacitor region has a recessed insulator layer relative to the insulator layer of the non-capacitor region. Specifically, the capacitor region 206 comprises high-k/workfunction metal stack stacks $204_C$ having the recessed trench and fin structure $202_C$ as described above in FIGS. 9A-11B. Additionally as shown the FET structure can have a ground 232 formed perpendicularly to the high-k/workfunction metal stack structures $204_C$, $204_{NC}$ and can have a ground 234 formed parallel with the high-k/workfunction metal stack structures. Additionally, as shown the capacitor region fins $202_C$ and the capacitor region high-k/workfunction metal stack structures $204_C$ are connected and act as one electrode of the capacitor. The grounds 232, 234 and/or vias 236 can function as another electrode for the capacitor. Within the capacitor region 206, vias 236 can be formed over the high-k/workfunction metal stack structures $204_C$ such that the vias 236 are arranged within the high-k/workfunction metal stack 204. Note that the gate does not have to be at a minimum pitch/width but can be at a relaxed pitch/width thus allowing plenty of room for a gate contact, i.e., via 236. It is further appreciated that following the formation of the gates and/or grounds, conductive contacts may be formed by, for example, etching vias in the insulator layer to expose the active regions of the devices, and depositing conductive material in the vias.

Figure 13:
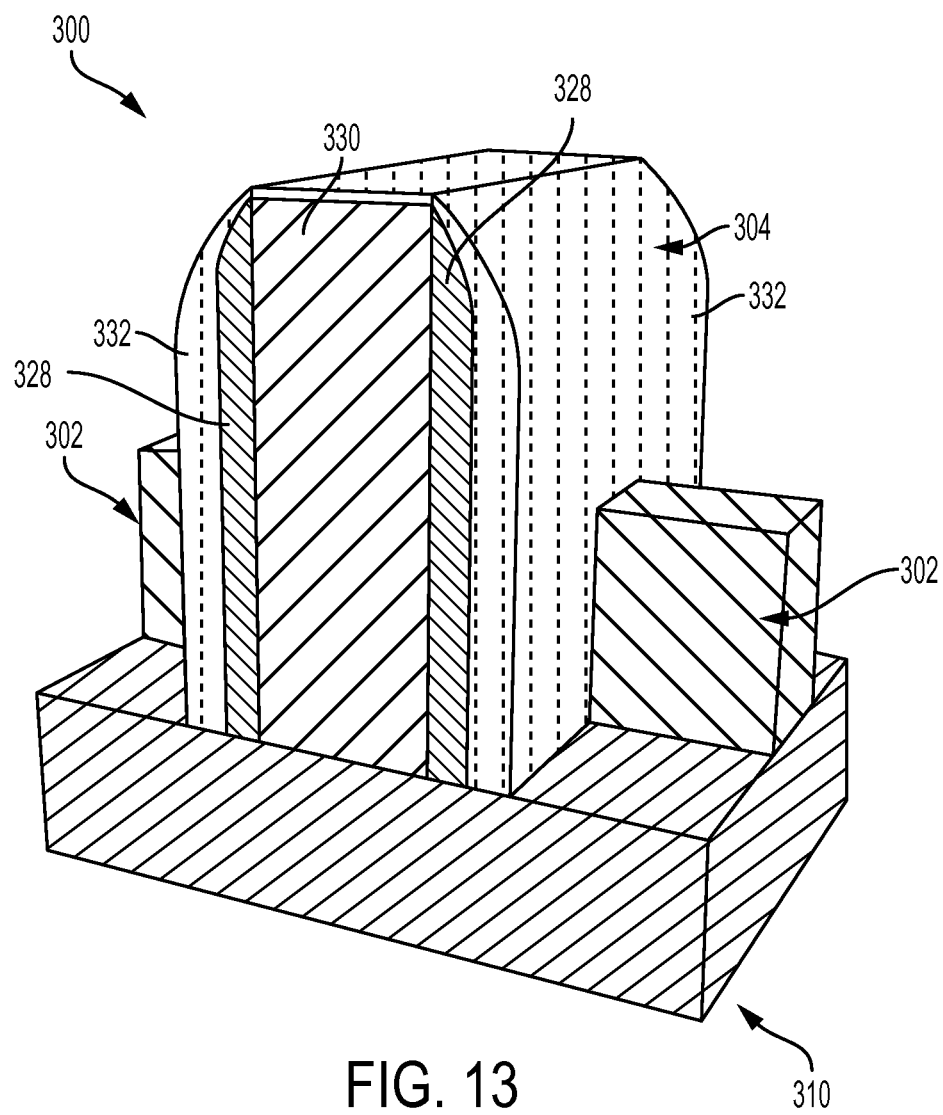
FIG. 13 is a cross-section view of an example gate stack structure formed on a fin that is patterned in a substrate of a FET structure.

Finally, the gate stack structures discussed herein can generally be any suitable gate stack structure. FIG. 13 is a cross-section view of an example gate stack structure 304 formed on a fin 302 that is patterned in a substrate 310 of a FET structure 300. The gate stack 304 can be formed of any suitable gate forming method. As such, the gate stack 304 can include a high-k dielectric layer 328 and a gate metal region 330. In some embodiments, the gate stack structure 304 can also include a spacer 332. In some aspects, the high-K layer 328 can have vertical components, e.g. under gate metal region 330 (not shown). Additionally, in some aspects gate metal region 330 can be a dummy gate prior to gate pull and high-k/workfunction metal stack deposition or, alternatively, gate metal region 330 can be the high-k/workfunction metal stack prior to any recess to form a self-aligning contact (SAC) cap.

It will further be appreciated by one of ordinary skill in the art that the fins can also be modified, i.e., widened, using epitaxial growth either before, during, or after gate formation. As used herein, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

As used herein, removal is any process that removes material from the wafer: examples include etch processes (either wet or dry), and chemical-mechanical planarization (CMP), etc.

As used herein, patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated capacitor device, comprising:
a fin structure patterned in a substrate;
a gate stack structure formed over the fin structure;
an insulator layer disposed over the substrate;
a non-capacitor region comprising a portion of the fin structure, gate stack structure, and insulator layer; and
a capacitor region comprising a portion of the fin structure, gate stack structure, and insulator layer such that the fin structure forming the capacitor region has a recessed insulator layer relative to the insulator layer of the non-capacitor region.

2. The integrated capacitor device of claim 1, wherein the capacitor region further comprises a gate overhang recess.

3. The integrated capacitor device of claim 1, wherein the capacitor region further comprises a gate metal disposed above the recessed insulator layer.

4. The integrated capacitor device of claim 3, wherein the gate metal is tungsten.

5. The integrated capacitor device of claim 1, further comprising at least one ground contacting the gate stack structure.

6. The integrated capacitor device of claim 1, wherein the portion of the fin structure within the capacitor region has a greater revealed height than the portion of the fin structure within the non-capacitor region.

7. The integrated capacitor device of claim 6, wherein the portion of the fin structure in the capacitor region has a revealed height of between about 35 nanometers and 100 nanometers.

* * * * *